United States Patent [19]

Brosch et al.

[11] Patent Number: 4,614,885
[45] Date of Patent: Sep. 30, 1986

[54] PHASE SPLITTER WITH LATCH

[75] Inventors: Rudolf Brosch, Sindelfingen; Joachim Keinert, Boeblingen; Erich Klink; Friedrich C. Wernicke, both of Schoenaich, all of Fed. Rep. of Germany

[73] Assignee: International Business Machines Corporation, Armonk, N.Y.

[21] Appl. No.: 630,544

[22] Filed: Jul. 13, 1984

[30] Foreign Application Priority Data

Aug. 17, 1983 [EP] European Pat. Off. ........ 83108130.2

[51] Int. Cl.⁴ ..................... H03K 3/023; H03K 3/286; H03K 3/288
[52] U.S. Cl. .................................. 307/513; 307/362; 307/475; 307/289; 307/291
[58] Field of Search ........... 307/455, 475, 513, 247 R, 307/530, 355, 362, 289, 291, 272 A, 479

[56] References Cited

U.S. PATENT DOCUMENTS

| | | |
|---|---|---|
| 3,636,377 | 1/1972 | Economopoulos ............. 307/291 X |
| 4,147,943 | 4/1979 | Peterson ............................... 307/355 |
| 4,276,485 | 6/1981 | Rydval ............................ 307/291 X |
| 4,309,625 | 1/1982 | Takahashi ....................... 307/291 X |
| 4,396,845 | 8/1983 | Nakano ................................. 307/475 |
| 4,401,901 | 8/1983 | Ochi ..................................... 307/362 |
| 4,506,171 | 3/1985 | Evans ............................. 307/530 X |
| 4,542,309 | 9/1985 | Klein et al. ......................... 307/513 |

FOREIGN PATENT DOCUMENTS 113192 9/1980 Japan .................................. 307/475

OTHER PUBLICATIONS

Heimeler et al., IBM Tech. Discl. Bull.; vol. 24, No. 1B, pp. 534–535, 6/1981.

Primary Examiner—Larry N. Anagnos
Attorney, Agent, or Firm—Robert E. Sandt

[57] ABSTRACT

A phase splitter with latch comprises a true complement generator in the form of a current switch (T1, T2, T3, R3) which supplies two complementary output signals in response to an input signal (VIN). The outputs of this true complement generator are in each case connected to an associated emitter follower (T4, T5). The two emitter followers (T4, T5) have identical emitter resistors (R6, R7) which simultaneously serve as collector load resistors of two cross-coupled transistors (T6, T7) also comprise identical but higher emitter resistors (R13, R14) than the emitter followers (T6, T7). The emitters of the cross-coupled transistors (T6, T7) are each connected to one of the two inputs of an output stage (T8, T9, T11) consisting of a current switch. This current switch is connected to operating voltage (VEE) through a clock-controlled transitor (T11). Upon actuation of the output stage, i.e., when transistor (T11) is on, the active emitter resistance of one of the cross-coupled transistors (T6, T7) is pulled below the value of the emitter resistors (R6, R7) of the emitter followers (T4, T5), thus causing the latch circuit to be latched as a function of the input signal.

3 Claims, 3 Drawing Figures

PHASE SPLITTER WITH LATCH

FIELD OF INVENTION

The invention concerns phase splitters with a latch, comprising a true complement generator, a latch circuit, and an output stage.

DESCRIPTION OF PRIOR ART

In their simplest form, phase splitters consist of an inverter supplying at its output the inverted value of an input signal applied to it, while the non-inverted value is supplied by a direct connection of the input with an associated further output. The numerous published and patented modifications of this basic form show that for solving new problems different improvements and refinements are necessary. Thus, the mere generation of the inverted or complementary output signal and non-inverted or true output signal from a predetermined input signal (which is tantamount to the generation of an in-phase and an anti-phase signal) is frequently insufficient for ensuring the desired quality of the phase splitter. The requirements of increased speed, reduced power consumption and accurate time relations between the individual signals in the circuit frequently necessitate the development of new improved circuits and operating modes. In addition, circuits produced in integrated technology should be such that they require a minimum of space when integrated in a semiconductor device.

Bistable circuits, for example, flip-flops, which include latch circuits, are also known in large numbers and have been used widely. The operation of these circuits is substantially such that an input receives a set signal in response to which an in-phase and an anti-phase output signal is generated at the outputs. These output signals are maintained as a result of the feedback or latch function, even if the set signal is disconnected from the input. The output signals, i.e., the conductive state of the circuit is maintained until a reset signal is applied to a reset input. Known circuits of this type generally operate in such a manner that the output signals are delayed over the input signal triggering the switch process. The magnitude of this delay is a function of the duration of the latch or switch process of the circuit. In high-speed circuits of this type such delays are often undesirable or even inadmissible.

Thus, a bistable latch circuit is known from German Auslegeschrift 24 22 123, wherein the delay of the output signal is reduced over the triggering input signal. For this purpose, an input-output circuit is provided which supplies an input signal in direct response to an output signal. The input/output circuit has a latch circuit coupled to it which is latched by the input signal, thus maintaining the output signal. This circuit has the disadvantage that the latch circuit operates all the time, thus permanently consuming power, in addition to having to be switched concurrently with the input signal. This switching puts a load on the input/output circuit and leads to undesirable delays.

Quite a number of applications have become known, for which the phase splitter is made up of a true complement generator and a latch circuit. This combination is aimed at rapidly providing anti-phase output signals in response to an input signal and at then effecting latching such that the existing switching state is maintained even after the input signal has been switched off or if a second input signal, complementary to the first, is subsequently applied. Attention is drawn in particular to applications involving latching buffer and read circuits for semiconductor memories. Buffer circuits are described, for example, in "IBM Technical Disclosure Bulletin", Vol. 20, No. 4, September 1977, pages 1426 to 1429, and in "IBM Technical Disclosure Bulletin", Vol. 18, No. 11, April 1976, pages 3597 and 3598. These circuits comprise, in addition to a true complement generator, a latch circuit in which the signals supplied by the true complement generator are stored and kept available for further use even after termination of the triggering input signal of the true complement generator.

The circuit of the former publication has the disadvantage that the output signal is available only after termination of the latch process and that elaborate clocking is required for the circuit. The circuit covered by the latter publication is also subject to delays, as the latch circuit, connected in parallel to the outputs of the true complement generator, causes the output signals to be influenced by the latching process.

The latching read amplifiers according to "IBM Technical Disclosure Bulletin", Vol. 24, No. 1B, June 1981, pages 534 and 535 and the German Offenlegungsschrift No. 27 21 851 have similar disadvantages. In either case, the latch circuits, in the form of flip-flops, are permanently on, i.e., they draw current all the time and have to be switched from one state to the other for a particular switch process, which leads to additional delays. The chief disadvantages these known phase splitters have in common are their susceptibility to temperature fluctuations and noise signals, their high power consumption, and their long delays.

In addition, digital input circuits (e.g., of semiconductor memories) with input signals of the order of the positive supply voltage are often required for controlling subsequent circuits, whose switching level is just above that of the negative supply voltage. This necessitates internal level converters shifting the voltage of the input signals towards values close to the negative supply voltage. Unless additional means are used, this requirement cannot be met by the known phase splitters either.

SUMMARY OF THE INVENTION

This is to be remedied by the invention. The invention, as characterized in the claims, solves this problem by providing a rapidly switching phase splitter with a latch, wherein the output steps are connected to the supply voltage by a clock-controlled switch to save power, and wherein when this switch is on, the input information is latched and a desired level shift effected.

The circuit has short switching times and is highly insusceptible to voltage and temperature variations as well as to process tolerances.

One way of carrying out the invention will be described in detail below with reference to the accompanying drawings which illustrate one specific embodiment.

Figure 1:
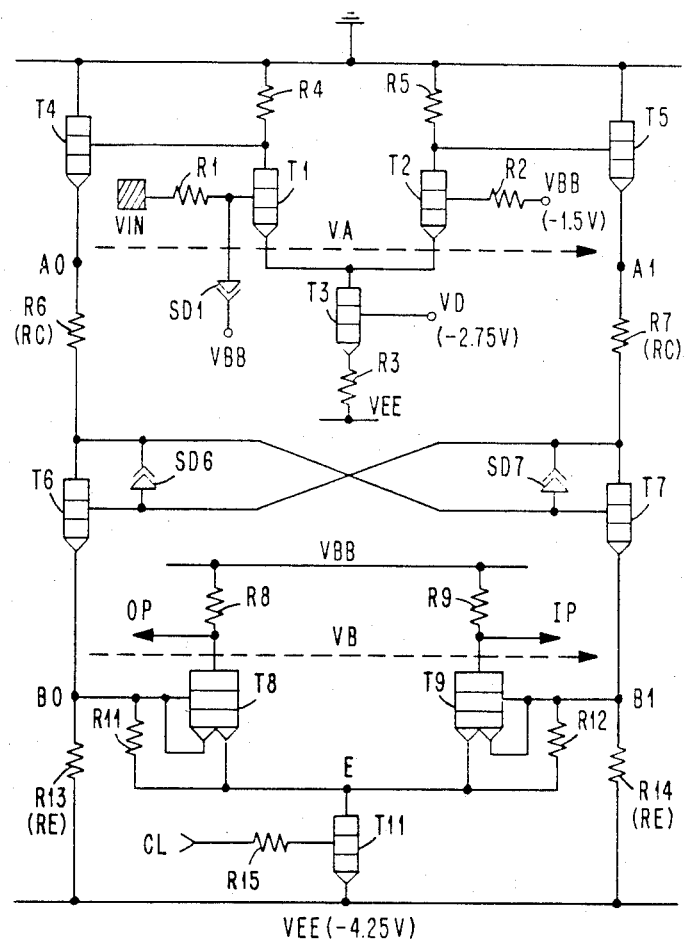
FIG. 1 is an example of the phase splitter according to the invention.

The phase splitter according to the invention comprises a current switch with two emitter-coupled transistors T1 and T2 acting as a true complement generator. Through associated resistors R4 and R5, the collectors of these transistors are connected to one pole of the operating voltage, in this case to ground. The two coupled emitters of the transistors T1 and T2 are connected to a current source made up of a transistor T3 which is linked to an operating voltage VEE ($-4.25$ V) through an emitter R3. The base of transistor T3 is connected to a voltage VD ($-2.75$ V). The base of one emitter-coupled transistor T2 is connected to an operating voltage VBB ($-1.5$ V) through a resistor R2. The base of the other emitter-coupled transistor T1 is connected to the input VIN of the true complement generator through a resistor R1. For this purpose, the base of this transistor is additionally linked to the operating voltage VBB through a Schottky diode SD1. The collectors of the two emitter-coupled transistors T1 and T2 are connected to the base of two transistors T4 and T5 forming emitter followers and having their collectors connected to ground. Resistors R6 and R7, which simultaneously act as load elements of two cross-coupled transistors T6 and T7 forming the latch circuit, serve as emitter resistors of the two emitter followers. The collector base junctions of the two cross-coupled transistors T6 and T7 are each bridged by one associated Schottky diode SD6 or SD7. The emitter resistors R13 and R14 of the cross-coupled transistors T6 and T7 are connected to the operating voltage VEE ($-4.25$ V). The emitters of the cross-coupled transistors T6 and T7 are each connected to one of the two inputs of an output stage which in turn consists of a current switch. This current switch comprises two emitter-coupled transistors T8 and T9, whose collectors are connected to the operating voltage VBB ($-1.5$ V) through resistors R8 and R9. In the emitter circuit of the two transistors T8 and T9 a switch made up of a transistor T11 is provided, the emitter of the latter transistor being connected to the operating voltage VEE and the collector to the interconnected emitters of the two transistors T8 and T9. The switch consisting of transistor T11 is controlled by a clock CL which is applied to the base of T11 by a resistor R15. The base-emitter junctions of the two transistors T8 and T9 are bridged by resistors R11 and R12. The collectors of the transistors T8 and T9 form complementary outputs OP and IP of the phase splitter according to the invention. As a result of the operating voltage VBB applied to it ($-1.5$ V in the example described), this phase splitter a threshold value of $-1.5$ V. At the outputs IP and OP, the phase splitter supplies a signal swing of about 1.5 V above the operating voltage VEE ($-4.25$ V). Current switch T1, T2, acting as a true complement generator, converts the unilaterally applied input signal at input VIN into a difference signal VA between nodes A0 and A1 at the outputs of the two emitter followers T4, T5. This difference signal VA may be regarded as an internal input signal which is applied to the latch circuit. This latch circuit, consisting of resistors R6, R7, transistors T6 and T7 and resistors R13, R14, simultaneously acts as an amplifier. The internal difference signal VA is converted by the latch circuit into an amplified difference signal VB between nodes B0 and B1 at the emitters of transistors T6 and T7 forming the latch circuit. It is there where the amplified difference signal VB is sensed via the output stage with transistors T8 and T9 as soon as the clock-controlled switch T11 is switched on by a clock signal CL, so that the voltage at node E drops, approaching the operating voltage VEE.

The operation of the circuit will be described below in the unselected state, i.e., with switch T11 being off. For explaining the basic operation of the latch and amplifier circuit, attention is first of all drawn to FIG. 2 illustrating the partial circuit of the phase splitter according to FIG. 1. For the purpose of clarity, neither the input circuit nor the output circuit will be considered in conjunction with the clock-controlled switch T11. In the non-selected state, it does not matter whether the output stage is omitted, since the clock-controlled switch T11 and thus transistors T8 and T9 are off. Similarly, the omission of the true complement generator is irrelevant for appreciating the operation of the circuit, as the dependence of the difference signal VA between nodes A0 and A1 on the input signal applied to input VIN is defined by the current switch characteristics of the true complement generator, which are well-known. Therefore, it is admissible to regard the difference signal VA as the actual input signal of the latch and amplifier circuit.

To ensure that during operating the correct output signal is available at the outputs OP and IP of the phase splitter, the difference signal VB between nodes B0 and B1 must be applied with the correct polarity before the clock-controlled switch T11 is made conductive by clock CL. This means that the difference signal VB must promptly respond to any change in the input signal which is directly applied in the form of the internal difference signal VA between node A0 and A1 by the current switch used as a true complement generator.

Figure 3:
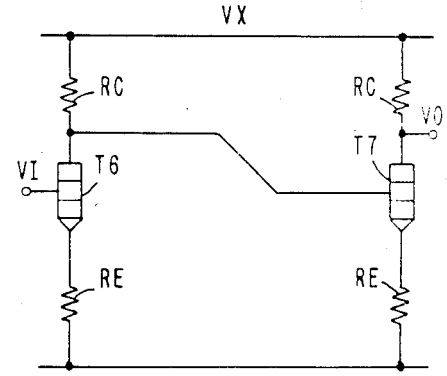

Transistors T6 and T7 forming the latch circuit are cross-coupled between base and collector similar to a conventional flip-flop. Care must be taken that the internal difference signal VA is not latched in the latch circuit when the phase splitter is in the unselected state. As will be described below, this requirement can be met by the ratio of the resistances RC/RE being lower than 1. For analyzing the latch condition, the coupling between the base of transistor T6 and the collector of transistor T7 was interrupted in the partial circuit according to FIG. 3. Thus, the circuit forms two inverters which are connected to the same current supply VX.

Figure 2:
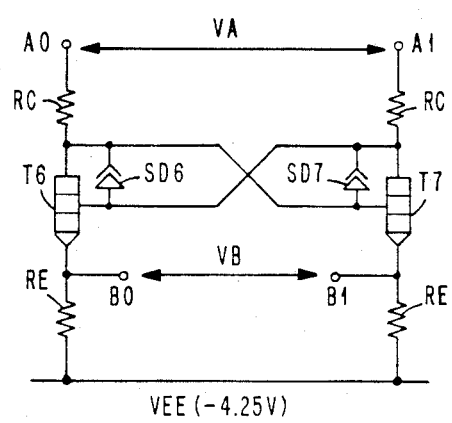
FIGS. 2 and 3 are partial circuit diagrams explaining the function of the phase splitter in accordance with the invention.

The amplification characteristic of this circuit may be derived from the subsequent equations and a condition be defined under which the voltage amplification exceeds 1, which is the necessary prerequisite for latching the latch circuit.

$$VI = VBE6 + I6 * RE \quad (1)$$
$$VO = VX - I7 * RC$$

$$I7 = \frac{VX - I6 * RC - VBE7}{RE}$$

$$\frac{VO}{VI} = \frac{RC}{RE}$$

where VI is the input voltage, VO is the output voltage, VX is the operating voltage, VBE6 and VBE7 are the base-emitter voltages of the transistors T6 and T7, I6 and I7 are the emitter and collector currents of the transistors T6 and T7, and RE and RC are the emitter and collector resistances, RE being the value of the resistors R13 and R14 and RC the value of the resistors R6 and R7 of the entire circuit of the phase splitter according to FIG. 1.

Equation (1) shows that the amplification depends only on the ratio RC/RE. As long as resistance RC is smaller than resistance RE, the amplification is less than 1, so that there is no latching of the input signal. This means that any change of the internal difference signal VA is immediately reflected by a change in the difference signal VB.

A further insight into the function of the circuit may be gained from the calculation of the amplification G=VB/VA. For this purpose, the subsequent equations are used for the partial circuit according to FIG. 2:

$$VA = RC*I7 + VBE6 + RE*I6 - RE*I7 - VBE7 - RC*I6$$

$$VB = RE*I6 - RE.I7$$

$$VBE6 \cong VBE7$$

The total amplification is:

$$G = \frac{VB}{VA} = \frac{RE\,(I6 - I7)}{RC\,(I6 - I7) + RE\,(I6 - I7)} \quad (2)$$

$$= \frac{RE}{RE - RC}$$

$$= \frac{1}{1 - \frac{RC}{RE}}$$

Equation (2) shows the positive feedback. Depending upon RC/RE, there are three instances of positive feedback.

If RC/RE<1, then a finite amplification, depending only on the value of the resistance ratio, is obtained from equation (2).

If the resistance ratio RC/RE approaches the value 1, the amplification tends towards infinity. In practice, of course, infinite amplification is unobtainable in circuits owing to the limited size of the active zones of the transistors. The smallest input signal, however, causes the amplifying element to be driven into saturation from the active range. In this case, one of the diodes SD6, SD7 in the circuit according to FIG. 1 becomes active, limiting the difference signal VB to about 500 mV.

An increase of the resistance ratio RC/RE above 1 leads to a latching of the cross-coupled transistors T6 and T7. Provided that an adequate base current is fed to the latching transistor, the input signal is no longer capable of changing the difference signal VB after latching.

As previously pointed out, in the non-selected state of the phase splitter, the difference signal VB must respond at once to changes of the difference signal VA. Therefore, a ratio RC/RE of 1.1/4<1, leading to an amplification of 1.4, was chosen in a practical example. In this case, there is no latching. To avoid oscillations resulting from positive feedback, the difference signal VA should be sufficiently high to make the clamping diode SD6 or SD7 of the latching transistor conductive. Assuming that the voltage at the conductive Schottky diode SD6 or SD7 is 500 mV (=VB), then a value of VA VB/1.4=360 mV is obtained for the lowest difference signal VA at which a stable operation is possible in the example considered.

The phase splitter in the selected state, i.e., with clock-controlled switch T11 being on, will be described in detail below.

One of the basic requirements the phase splitter according to the invention has to meet is that it should consume little power, particularly in the non-selected standby state. For this purpose, the emitters of the transistors T8 and T9 of the output stage are connected to the collector of transistor T11 which is made conductive upon application of a clock pulse CL, connecting said emitters to the most negative operating voltage VEE.

As soon as switch T11 is on, the output stage shows the known characteristics of a current switch comprising the transistors T8 and T9, whose bases receive the difference signal VB. If the internal difference signal VA is sufficiently high, either Schottky diode SD6 or SD7 is conductive, so that a maximum difference signal VB of about 500 mV is generated in the example considered. As previously mentioned, a difference signal VA<350 Mv is sufficient for that purpose. It is pointed out that the actual voltage at nodes B0 and B1 is of little interest. Important merely is the potential difference VB applied between the bases of transistors T8 and T9. The polarity of the difference signal VB depends, of course, on the logic state of the input signal applied to input VIN, which must be available before the clock-controlled switch T11 is actuated. As long as this switch is off, transistors T8 and T9 are non-conductive, the complementary outputs IP and OP are at an up level, and the potential at the common emitter node E of transistors T8 and T9 is connected to a mean value between the levels at nodes B0 and B1.

It is assumed, for example, that the potential at the base of transistor T8 is high compared with the potential at the base of transistor T9. For selection, clock signal CL is emitted, switching on the phase splitter in the described manner. As soon as the potential at node E is lowered relative to the collector current of transistor T11, the voltage at the base-emitter junction of transistor T8 increases until the latter becomes conductive, pulling down the potential at output OP. At the same time, the potential at the emitter of transistor T6 is kept at a value exceeding the potential of node E by a base-emitter voltage VBE.

The voltage at the collector of transistor T6 is lowered roughly the same value, so that the potential at the base of transistor T9 is still about 500 mV below the potential at the base of transistor T8, thus preventing transistor T9 from becoming conductive.

By means of the equations (1) and (2), the characteristic feature of the latch and amplifier circuit can be readily analyzed as a function of resistance RE after switch T11 has been actuated. The conductive base-emitter junction of one of the transistors T8 or T9 of the output stage forms a low-resistivity parallel shunt relative to the associated emitter resistor R13 or R14, so that the resistance RE of the latter is replaced by a new lower resistance re.

Assuming that the resistance re is only about several Ohm, then the ratio RC/re is bound to be much less than 1. Under this condition the latching of the latch circuit comprising the transistors T6 and T7 is effected in the above-described manner. As the complementary output signal derived from the input signal is latched, a level shift is effected, during which the high level of the input signal is converted into a level of the output signal, which is only 200 mV above the most negative operating voltage VEE. The phase splitter in accordance with the invention has excellent characteristics relative to power consumption and temperature changes and is highly insusceptible to noise signals and process tolerances. The resistance ratio RC/RE, which determines the function of the circuit, can be easily kept at a selected value. This value is independent of voltage and temperature changes and is hardly affected by process tolerances.

The maximum voltage at which the circuit operates is theoretically unlimited. The minimum operating voltage depends on the resistance RC which must provide an adequate base current for the respective transistor of the output stage. Assuming that the resistances are as usual, then there is a minimum operating voltage of at least 3 V at which the fast switching characteristics are maintained. As the several functions, such as level shifting, actuation of the transistors of the output stage, and latching of the input signal, are simultaneously effected, the delay from the input to the output of the phase splitter is extremely short. The power consumption, which depends on the size of the current source T3, R3 of the true complement generator and the resistance RE, is reduced to a minimum, as the function of the circuit is based on low difference signals and not on absolute voltage swings that have to be large for compensating for operating voltage and temperature fluctuations in standard phase splitters.

While the invention has been particularly shown and described with reference to the preferred embodiment thereof, it will be understood by those skilled in the art that various changes in form and details may be made therein without departing from the spirit and scope of the invention.

We claim:

1. Phase splitter with latch, comprising a true complement generator, a latch circuit, and an output stage, characterized in that the two outputs of the true complement generator, to whose input (VIN) the input signal is applied, are in each case connected to the input of an associated emitter-follower (T4, T5), that the two emitter followers (T4, T5) have identical emitter resistors (R6, R7) which simultaneously act as collector load resistors of two cross-coupled transistors (T6, T7) forming the latch and amplifier circuit, that the two cross-coupled transistors (T6, T7) also comprise identical but higher emitter resistors (R13, R14) than the emitter followers (T6, T7), that the emitters of the cross-coupled transistors (T6, T7) are each connected to one of the two inputs (B0, B1) of the output stage (T8, T9, T11) which through a clock-controlled switch (T11) is connected to operating voltage (VEE), pulling down the active emitter resistance of the cross-coupled transistors (T6, T7) below the value of the emitter resistors (R6, R7) of the emitter followers (T4, T5), thus causing the latch circuit to be latched as a function of the input signal.

2. Phase splitter according to claim 1, characterized in that the true complement generator comprises an emitter-coupled current switch with two transistors (T1, T2), in whose emitter circuit a common current source (T3, R3) is arranged.

3. Phase splitter according to claim 1, characterized in that the output stage comprises an emitter-coupled current switch with two transistors (T8, T9), in whose emitter circuit the clock-controlled switch (T11) is arranged which in the conductive state switches the base-emitter junction of the respective conductive branch parallel to the emitter resistor of the cross-coupled transistors (T6, T7), reducing the active emitter resistance.

* * * * *